United States Patent
Chao et al.

(10) Patent No.: US 8,093,504 B2
(45) Date of Patent: Jan. 10, 2012

(54) CIRCUIT BOARD STRUCTURE EMPLOYING FERRITE ELEMENT

(75) Inventors: Shih-Chieh Chao, Taipei (TW);
Chih-Wen Huang, Taipei (TW);
Chun-Lin Liao, Taipei (TW)

(73) Assignee: Tatung Company, Taipei (TW)

( * ) Notice: Subject to any disclaimer, the term of this patent is extended or adjusted under 35 U.S.C. 154(b) by 354 days.

(21) Appl. No.: 12/414,659

(22) Filed: Mar. 30, 2009

(65) Prior Publication Data
US 2010/0200281 A1 Aug. 12, 2010

(30) Foreign Application Priority Data
Feb. 6, 2009 (TW) ................................ 98103879 A

(51) Int. Cl.
*H05K 1/09* (2006.01)
(52) U.S. Cl. ............................................. 174/257
(58) Field of Classification Search .............. 174/257, 174/258, 261, 277, 659
See application file for complete search history.

(56) References Cited

U.S. PATENT DOCUMENTS

| | | | | |
|---|---|---|---|---|
| 5,015,972 A | * | 5/1991 | Cygan et al. | 333/32 |
| 5,831,331 A | * | 11/1998 | Lee | 257/659 |
| 5,990,417 A | * | 11/1999 | Senda et al. | 174/391 |
| 6,125,044 A | | 9/2000 | Cherniski et al. | |
| 6,914,183 B2 | * | 7/2005 | Inazawa et al. | 174/391 |
| 2001/0032737 A1 | * | 10/2001 | Taira | 174/257 |
| 2003/0102154 A1 | * | 6/2003 | Haba | 174/257 |
| 2008/0314628 A1 | * | 12/2008 | Song et al. | 174/257 |
| 2009/0020324 A1 | * | 1/2009 | Kamei et al. | 174/257 |
| 2009/0288862 A1 | * | 11/2009 | Tamura et al. | 174/257 |
| 2010/0038121 A1 | * | 2/2010 | Kosowsky | 174/257 |
| 2010/0294547 A1 | * | 11/2010 | Hatanaka et al. | 174/257 |

* cited by examiner

*Primary Examiner* — Chandrika Prasad
(74) *Attorney, Agent, or Firm* — Jianq Chyun IP Office

(57) ABSTRACT

A circuit board structure includes a dielectric layer, a first metal layer, a second metal layer and a first ferrite element. The first metal layer is disposed on an upper surface of the dielectric layer and has a first circuit area, a second circuit area and a first metallic neck connecting the first circuit and the second circuit areas. The second metal layer is disposed on a lower surface of the dielectric layer and has a third circuit area, a fourth circuit area and at least a second metallic neck connecting the third circuit and the fourth circuit areas. The orthogonal projections of the first and the second metallic necks on the upper surface are not overlapped. The first ferrite element is disposed on the upper surface and overlays at least one of the orthogonal projections of the first and the second metallic necks on the upper surface.

10 Claims, 8 Drawing Sheets

CIRCUIT BOARD STRUCTURE EMPLOYING FERRITE ELEMENT

CROSS-REFERENCE TO RELATED APPLICATION

This application claims the priority benefit of Taiwan application serial no. 98103879, filed on Feb. 6, 2009. The entirety of the above-mentioned patent application is hereby incorporated by reference herein and made a part of specification.

BACKGROUND OF THE INVENTION

1. Field of the Invention

The present invention generally relates to a circuit board structure, and more particularly, to a circuit board structure employing ferrite elements.

2. Description of Related Art

Along with the development aiming at high frequency and low voltage of the electronic industry, a circuit system faces an inevitable problem of electromagnetic noise interference. During the operation of the circuit on a circuit board, some components carrying high-speed digital signals or a high power component, for example, a clock signal generator or a power amplifier, often become a major source of electromagnetic noise. When the above-mentioned components produce electromagnetic noise, the electromagnetic noise would propagate in electromagnetic wave form on the circuit board so that the other components on the circuit board are interfered.

The electromagnetic interference (EMI) problem can be solved today by properly a circuit design and layout. It is to say, the influence of the above-mentioned electromagnetic interference on a circuit board can be reduced by a proper design to change the layout or components.

SUMMARY OF THE INVENTION

Accordingly, the present invention is directed to a circuit board structure capable of suppressing electromagnetic noise.

The present invention provides a circuit board structure, which includes a dielectric layer, a first metal layer, a second metal layer and a first ferrite element. The dielectric layer has an upper surface and a lower surface opposite to the upper surface. The first metal layer is disposed on the upper surface of the dielectric layer and has a first circuit area, a second circuit area and a first metallic neck connecting the first circuit area and the second circuit area. The second metal layer is disposed on the lower surface of the dielectric layer and has a third circuit area, a fourth circuit area and at least a second metallic neck connecting the third circuit area and the fourth circuit area, wherein the orthogonal projections of the first metallic neck and the second metallic neck on the upper surface of the dielectric layer are not overlapped with each other. The first ferrite element is disposed on the upper surface of the dielectric layer and overlays at least one of the orthogonal projections of the first metallic neck and the second metallic neck on the upper surface of the dielectric layer.

In an embodiment of the present invention, the orthogonal projections of the above-mentioned first ferrite element and second metallic neck on the upper surface of the dielectric layer are overlapped with each other.

In an embodiment of the present invention, the above-mentioned circuit board structure further includes a second ferrite element disposed at the lower surface of the dielectric layer.

In an embodiment of the present invention, the orthogonal projections of the above-mentioned second ferrite element, first ferrite element and first metallic neck on the upper surface of the dielectric layer are overlapped with each other.

In an embodiment of the present invention, the orthogonal projections of the above-mentioned first ferrite element and second metallic neck on the upper surface of the dielectric layer are overlapped with each other, and the orthogonal projections of the second ferrite element, the first ferrite element and the first metallic neck on the upper surface of the dielectric layer are overlapped with each other.

In an embodiment of the present invention, the above-mentioned second ferrite element overlays the second metallic neck.

In an embodiment of the present invention, the orthogonal projections of the above-mentioned second ferrite element, first ferrite element and second metallic neck on the upper surface of the dielectric layer are overlapped with each other.

In an embodiment of the present invention, the material of the above-mentioned dielectric layer includes glass fiber.

In an embodiment of the present invention, the material of the above-mentioned first metal layer includes copper.

In an embodiment of the present invention, the material of the above-mentioned second metal layer includes copper.

Based on the described above, in the circuit board structure of the present invention, the orthogonal projections of the first metallic neck and the second metallic neck on the upper surface of the dielectric layer are not overlapped with each other. Thus, the magnetic field of the electromagnetic noise would spread outside the dielectric layer and rather than concentrate in the dielectric layer between the first metallic neck and the second metallic neck. In addition, the magnetic field can be suppressed easily by employing the first ferrite element to overlay the first metallic neck, which contributes reducing the electromagnetic noise transmission to achieve the effect of suppressing the electromagnetic noise.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
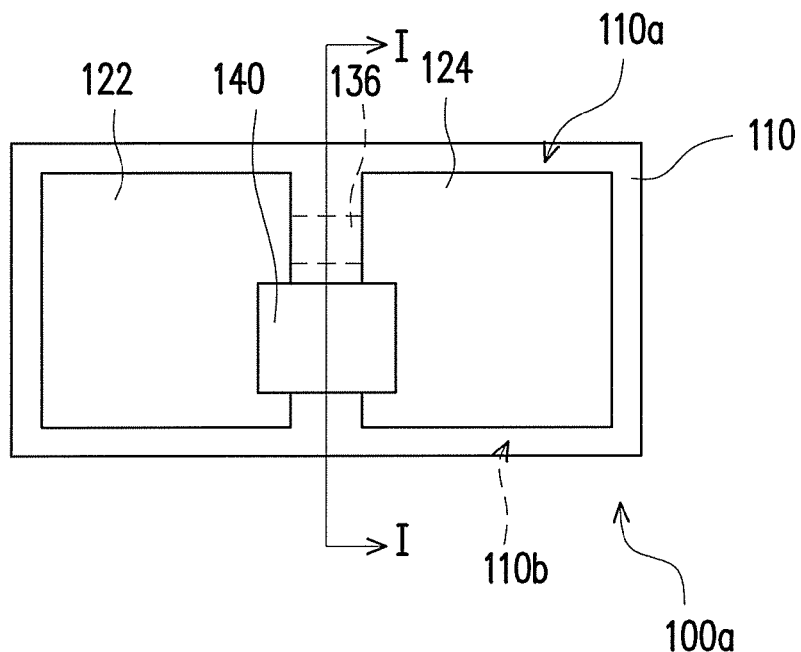
FIG. 1A is a diagram of a circuit board structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
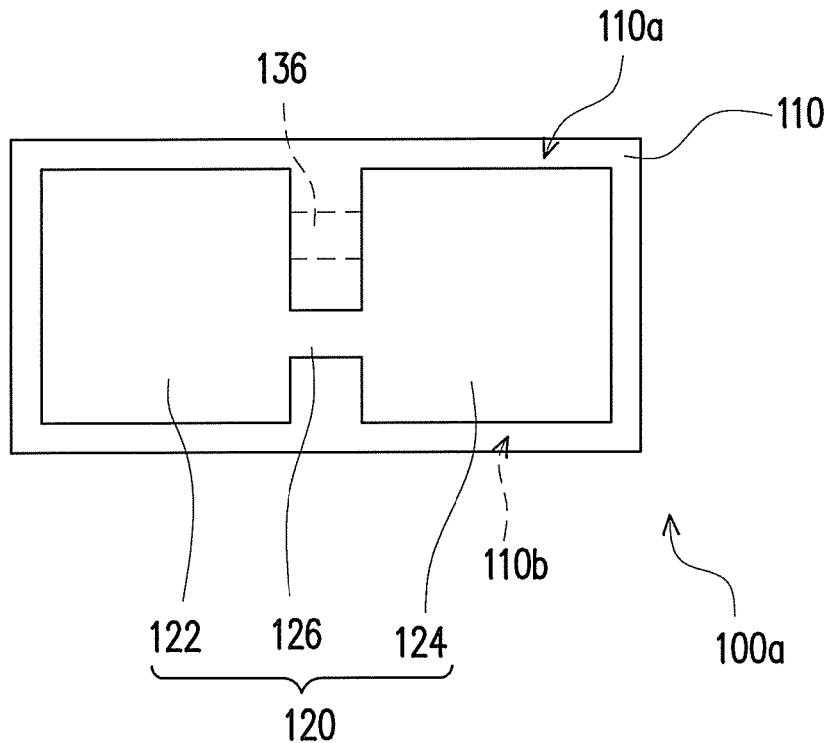
FIG. 1B is a diagram of the circuit board structure of FIG. 1A, which does not use a first ferrite element to overlay the first metallic neck.
Figure 1C:
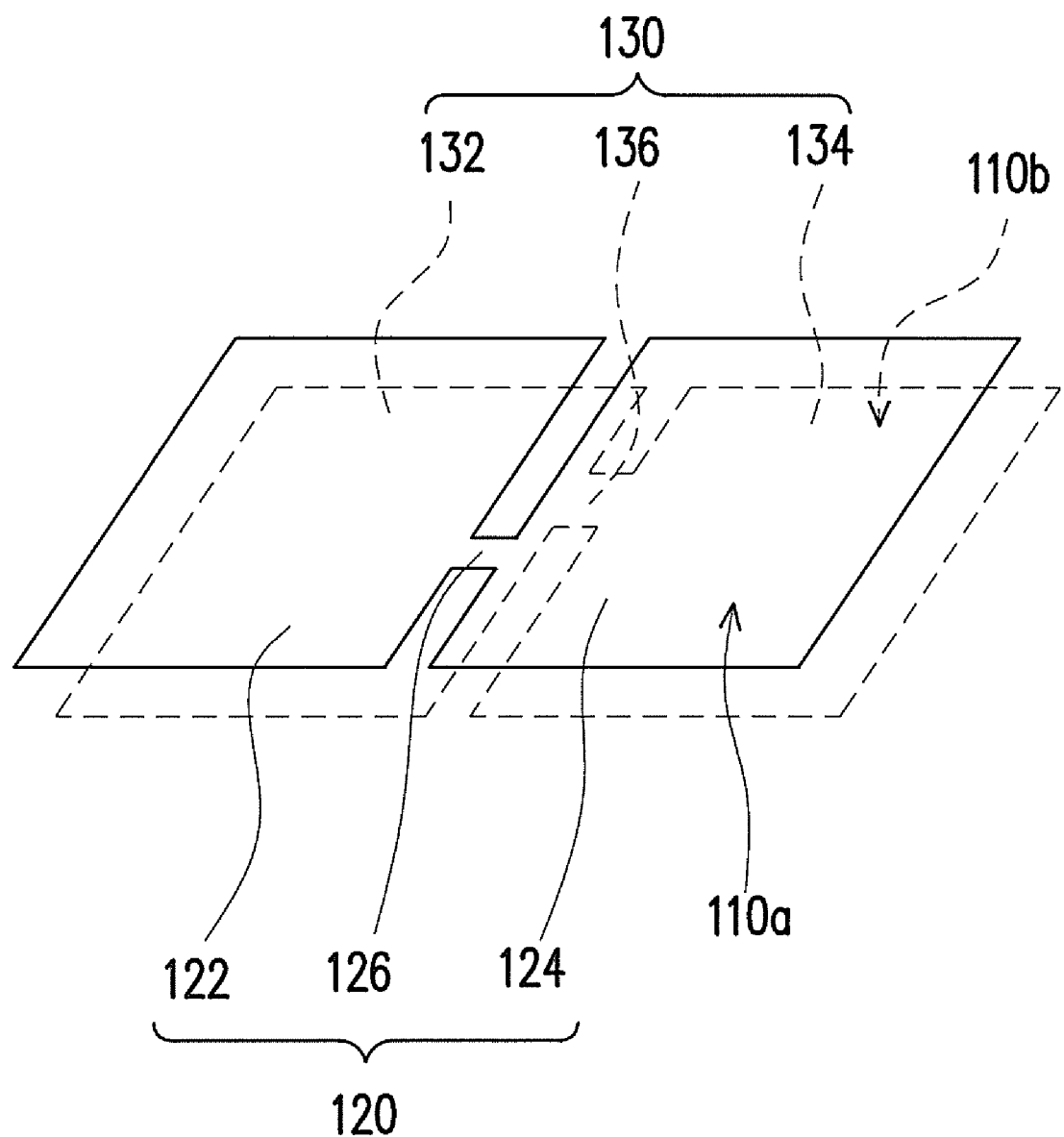
FIG. 1C is a diagram showing the first metal layer and the second metal layer of FIG. 1B.
Figure 1D:
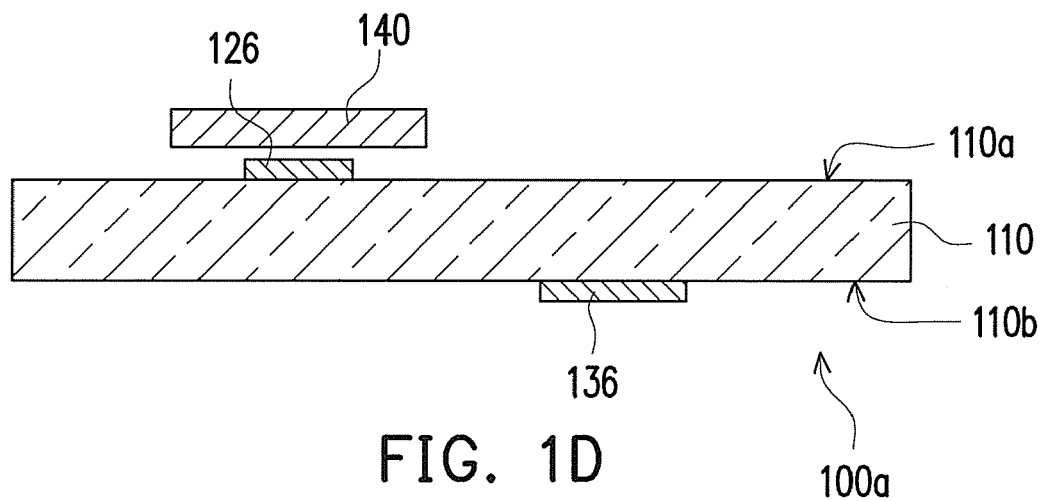
FIG. 1D is a cross-sectional diagram along line I-I in FIG. 1A.

FIG. 1A is a diagram of a circuit board structure according to an embodiment of the present invention, FIG. 1B is a diagram of the circuit board structure of FIG. 1A, which does not use a first ferrite element to overlay the first metallic neck, FIG. 1C is a diagram showing the first metal layer and the second metal layer of FIG. 1B and FIG. 1D is a cross-sectional diagram along line I-I in FIG. 1A. Referring to FIG. 1A-1C, in the embodiment, a circuit board structure 100a includes a dielectric layer 110, a first metal layer 120, a second metal layer 130 and a first ferrite element 140.

In more details, the dielectric layer 110 has an upper surface 110a and a lower surface 110b opposite to the upper surface 110a, wherein the material of the dielectric layer 110 includes glass fiber.

The first metal layer 120 is disposed on the upper surface 110a of the dielectric layer 110 and has a first circuit area 122, a second circuit area 124 and a first metallic neck 126, wherein the first metallic neck 126 connects the first circuit area 122 and the second circuit area 124. In the embodiment, the first metal layer 120 serves as, for example, a power layer. The material of the first metal layer 120 includes copper.

The second metal layer 130 is disposed on the lower surface 110b of the dielectric layer 110 and has a third circuit area 132, a fourth circuit area 134 and at least a second metallic neck 136 (in FIG. 1C, only one is exemplarily shown). The second metallic neck 136 connects the third circuit area 132 and the fourth circuit area 134, and the orthogonal projections of the first metallic neck 126 and the second metallic neck 136 on the upper surface 110a of the dielectric layer 110 are not overlapped with each other. In the embodiment, the second metal layer 130 serves as, for example, a grounding layer and the material of the second metal layer 130 includes copper.

It should be noted that, in the embodiment, the first circuit area 122 of the first metal layer 120 is corresponding to the third circuit area 132 of the second metal layer 130, and the second circuit area 124 of the first metal layer 120 is corresponding to the fourth circuit area 134 of the second metal layer 130. In the embodiment, the widths of the first metallic neck 126 and the second metallic neck 136 are different from each other. The orthogonal projections of the first metallic neck 126 and the second metallic neck 136 on the upper surface 110a of the dielectric layer 110 are not overlapped with each other and respectively located at two opposite sides of the dielectric layer 110.

Referring to FIGS. 1A and 1D, the first ferrite element 140 is disposed on the upper surface 110a of the dielectric layer 110 and the first ferrite element 140 overlays the first metallic neck 126. The ferrite material herein features high permeability and low conductivity, so that the first ferrite element 140 has high impedance for an electromagnetic field, which means the first ferrite element 140 can suppress the intensity of the electromagnetic field.

In the embodiment, since the orthogonal projections of the first metallic neck 126 and the second metallic neck 136 on the upper surface 110a of the dielectric layer 110 are not overlapped with each other, so that the magnetic field of the electromagnetic noise transmitted between the first circuit area 122 and the second circuit area 124 and between the third circuit area 132 and the fourth circuit area 134 would spread outside of the dielectric layer 110 and close to the first metallic neck 126 and the second metallic neck 136 rather than being concentrated in the dielectric layer 110 between the first metallic neck 126 and the second metallic neck 136.

In addition, the employed first ferrite element 140 is able to suppress the magnetic field intensity; therefore, when the first ferrite element 140 overlays the first metallic neck 126, the electromagnetic noise in the dielectric layer 110 between the first metallic neck 126 and the second metallic neck 136 can be effectively suppressed.

The circuit board structure 100a of the embodiment can further include a first dielectric layer (not shown), a second dielectric layer (not shown), a first component layer (not shown) and a second component layer (not shown). The circuit board structure 100a herein is located between the first component layer and the second component layer, the first dielectric layer is located between the first component layer and the first metal layer 120 and the second dielectric layer is located between the second component layer and the second metal layer 130, which means the circuit board structure 100a can be a multi-layers circuit board structure. It should be noted that the above-mentioned architecture of the circuit board structure is an example, which the present invention is not limited to.

The present invention does not limit the numbers, the locations, the widths and the shapes of the first metallic neck 126 and the second metallic neck 136, although the above-mentioned structure design defines the numbers of the first metallic neck 126 and the second metallic neck 136 are respectively one. Several different embodiments with a plurality of circuit board structures 100b-100l are depicted hereinafter.

Figure 2:
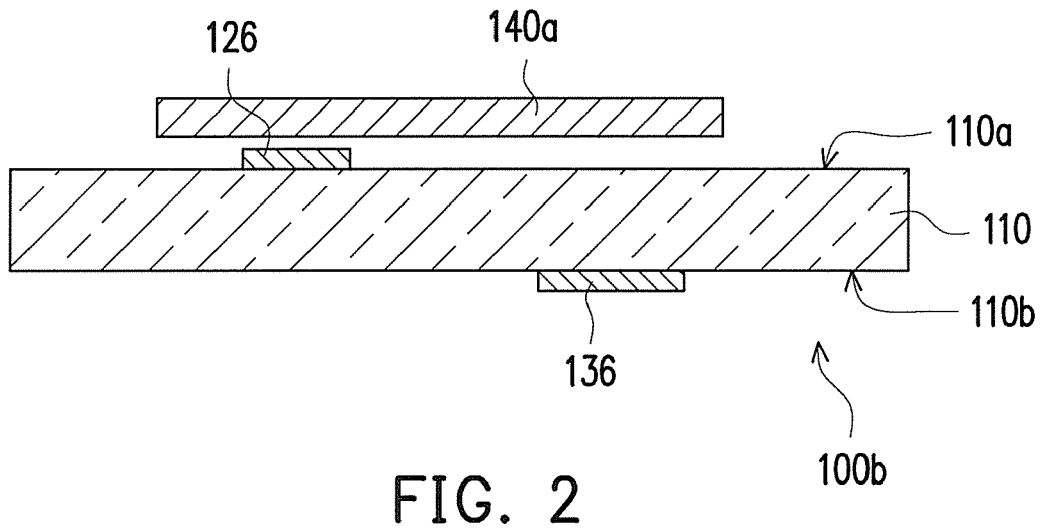
FIG. 2 is a cross-sectional diagram of a circuit board structure according to another embodiment of the present invention.

FIG. 2 is a cross-sectional diagram of a circuit board structure according to another embodiment of the present invention. Referring to FIGS. 1D and 2, the circuit board structure 100b of FIG. 2 is similar to the circuit board structure 100a of FIG. 1D except that the orthogonal projections of the first ferrite element 140a and the second metallic neck 136 of the circuit board structure 100b of FIG. 2 on the upper surface 110a of the dielectric layer 110 are overlapped with each other, where the first ferrite element 140a entirely overlays the orthogonal projections of the first metallic neck 126 and the second metallic neck 136 on the upper surface 110*a* of the dielectric layer 110.

Figure 3:
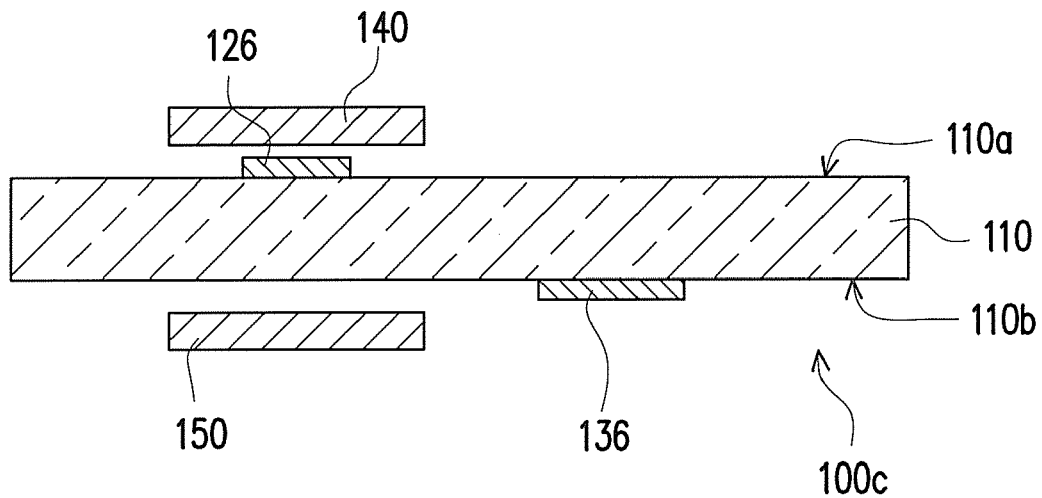
FIG. 3 is a cross-sectional diagram of a circuit board structure according to yet another embodiment of the present invention.

FIG. 3 is a cross-sectional diagram of a circuit board structure according to yet another embodiment of the present invention. Referring to FIGS. 1D and 3, the circuit board structure 100*c* of FIG. 3 is similar to the circuit board structure 100*a* of FIG. 1D except that the circuit board structure 100*c* of FIG. 3 further includes a second ferrite element 150. The second ferrite element 150 is disposed at the lower surface 110*b* of the dielectric layer 110, and the orthogonal projections of the first ferrite element 140, the second ferrite element 150 and the first metallic neck 126 on the upper surface 110*a* of the dielectric layer 110 are overlapped with each other, which means the second ferrite element 150 does not overlay the second metallic neck 136.

Figure 4:
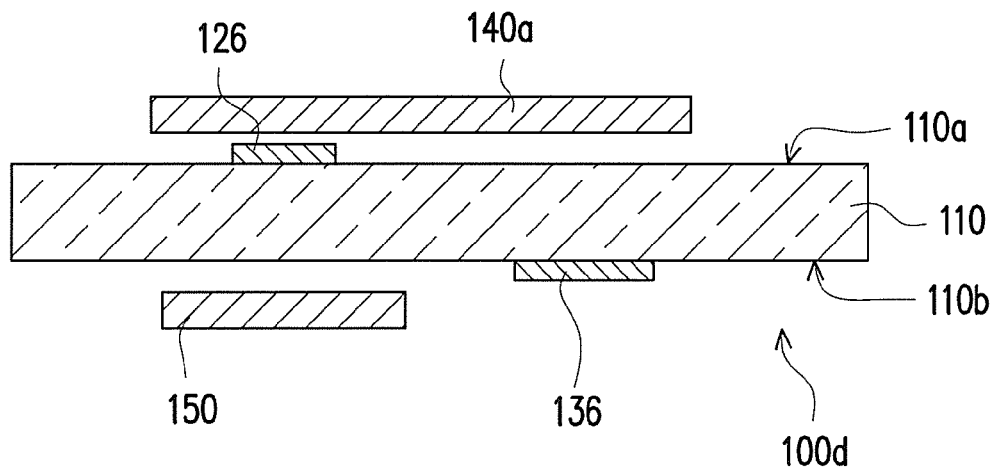
FIG. 4 is a cross-sectional diagram of a circuit board structure according to yet another embodiment of the present invention.

FIG. 4 is a cross-sectional diagram of a circuit board structure according to yet another embodiment of the present invention. Referring to FIGS. 3 and 4, the circuit board structure 10*d* of FIG. 4 is similar to the circuit board structure 100*c* of FIG. 3 except that the orthogonal projections of the first ferrite element 140*a* and the second metallic neck 136 of the circuit board structure 100*d* of FIG. 4 on the upper surface 110*a* of the dielectric layer 110 are overlapped with each other, which means the first ferrite element 140*a* entirely overlays the orthogonal projections of the first metallic neck 126 and the second metallic neck 136 on the upper surface 110*a* of the dielectric layer 110.

Figure 5:
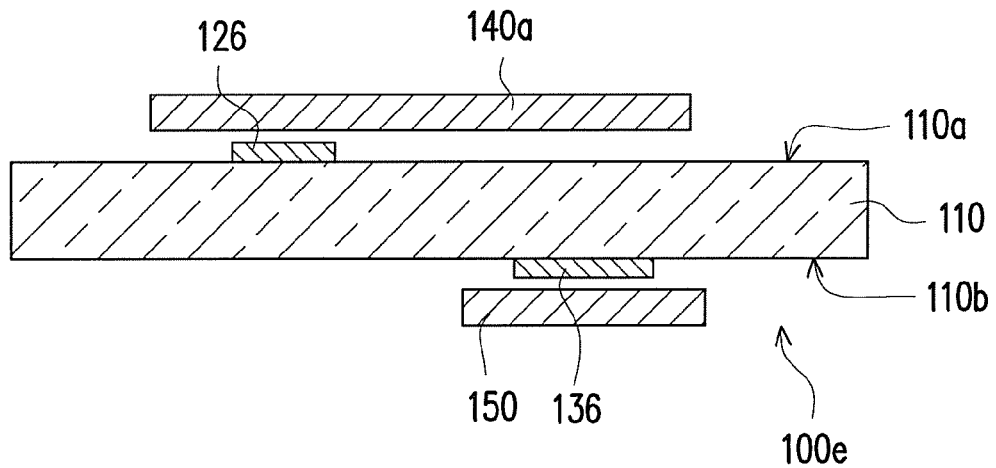
FIG. 5 is a cross-sectional diagram of a circuit board structure according to yet another embodiment of the present invention.

FIG. 5 is a cross-sectional diagram of a circuit board structure according to yet another embodiment of the present invention. Referring to FIGS. 4 and 5, the circuit board structure 100*e* of FIG. 5 is similar to the circuit board structure 100*d* of FIG. 4 except that the second ferrite element 150 of the circuit board structure 100*e* of FIG. 5 overlays the second metallic neck 136, and the orthogonal projections of the first ferrite element 140*a*, the second ferrite element 150 and the second metallic neck 136 on the upper surface 110*a* of the dielectric layer 110 are overlapped with each other, which means the second ferrite element 150 does not overlay the orthogonal projection of the first metallic neck 126 on the lower surface 110*b* of the dielectric layer 110.

Figure 6:
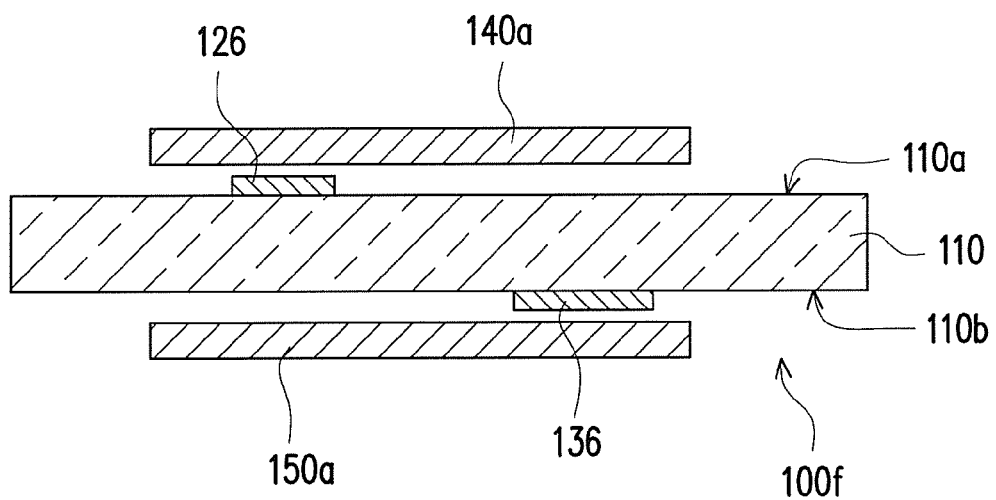
FIG. 6 is a cross-sectional diagram of a circuit board structure according to yet another embodiment of the present invention.

FIG. 6 is a cross-sectional diagram of a circuit board structure according to yet another embodiment of the present invention. Referring to FIGS. 5 and 6, the circuit board structure 100*f* of FIG. 6 is similar to the circuit board structure 100*e* of FIG. 5 except that the orthogonal projections of the second ferrite element 150*a* and the first ferrite element 140*a* of the circuit board structure 100*f* of FIG. 6 on the upper surface 110*a* of the dielectric layer 110 are overlapped with each other, which means the first ferrite element 140*a* entirely overlays the orthogonal projections of the first metallic neck 126 and the second metallic neck 136 on the upper surface 110*a* of the dielectric layer 110, and the second ferrite element 150*a* entirely overlays the orthogonal projections of the first metallic neck 126 and the second metallic neck 136 on the lower surface 110*b* of the dielectric layer 110.

In general, the layout of a circuit board structure needs to be considered both suppressing electromagnetic noise and maintaining the signal integrity. In order to have better signal integrity, the reference plane (usually the ground plane) of the signal line should keep as a whole as possible. In this sense, the circuit board structure 100*g* of FIG. 7 takes a following structure that an opening is made, wherein the opening has a width a little wider than the width of the first metallic neck 126 and is located at the position of the orthogonal projection of the first metallic neck 126 on the lower surface 110*b*. In this way, two second metallic necks 136*a* and 136*b* at both sides of the lower surface 110*b* of the dielectric layer 110 can be remained in the maximal extent and meanwhile the ferrite element 140 overlaying the first metallic neck 126 can still suppress the noise.

Figure 7:
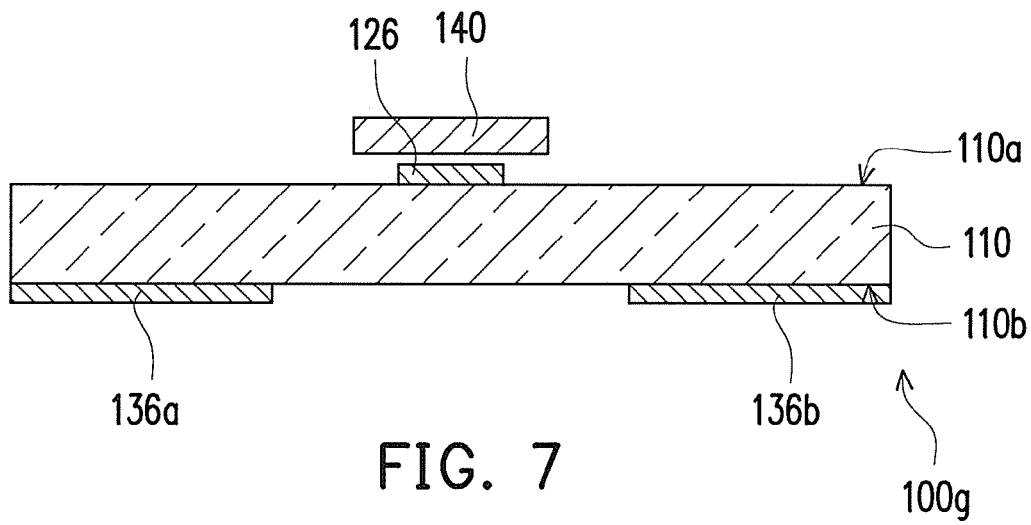
FIG. 7 is a cross-sectional diagram of a circuit board structure according to yet another embodiment of the present invention.
Figure 8:
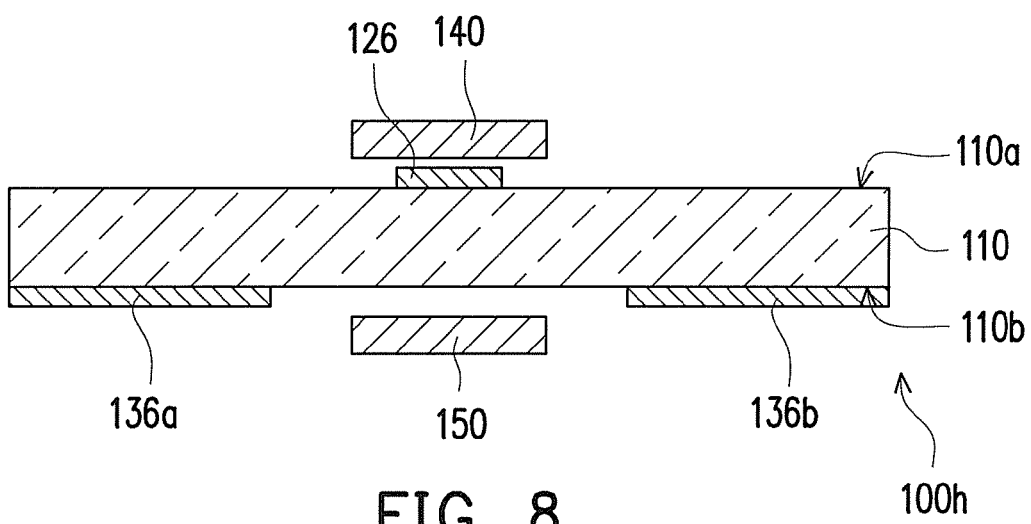
FIG. 8 is a cross-sectional diagram of a circuit board structure according to yet another embodiment of the present invention.

FIG. 8 is a cross-sectional diagram of a circuit board structure according to yet another embodiment of the present invention. Referring to FIGS. 7 and 8, the circuit board structure 100*h* of FIG. 8 is similar to the circuit board structure 100*g* of FIG. 7 except that the circuit board structure 100*h* of FIG. 8 further includes a second ferrite element 150. The second ferrite element 150 is disposed at the lower surface 110*b* of the dielectric layer 110, wherein the orthogonal projections of the first ferrite element 140, the second ferrite element 150 and the first metallic neck 126 on the upper surface 110*a* of the dielectric layer 110 are overlapped with each other, which means the second ferrite element 150 does not overlay the second metallic necks 136*a* and 136*b*.

Figure 9:
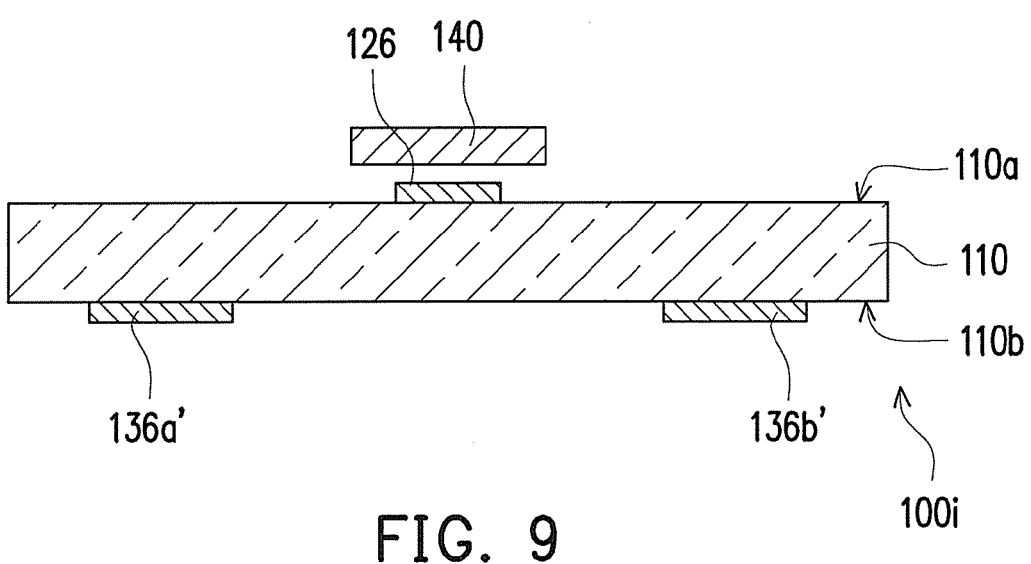
FIG. 9 is a cross-sectional diagram of a circuit board structure according to yet another embodiment of the present invention.

To meet the requirement of layout of a circuit board structure, sometimes, a single metal layer needs more than one metallic neck. FIG. 9 is a cross-sectional diagram of a circuit board structure according to yet another embodiment of the present invention. Referring to FIG. 9, the circuit board structure 100*i* of FIG. 9 is similar to the circuit board structure 100*a* of FIG. 1D except that the second metal layer 130 (FIG. 1C) of the circuit board structure 100*i* of FIG. 9 has two second metallic necks 136*a'* and 136*b'* and the first ferrite element 140 overlays the first metallic neck 126 only.

Figure 10:
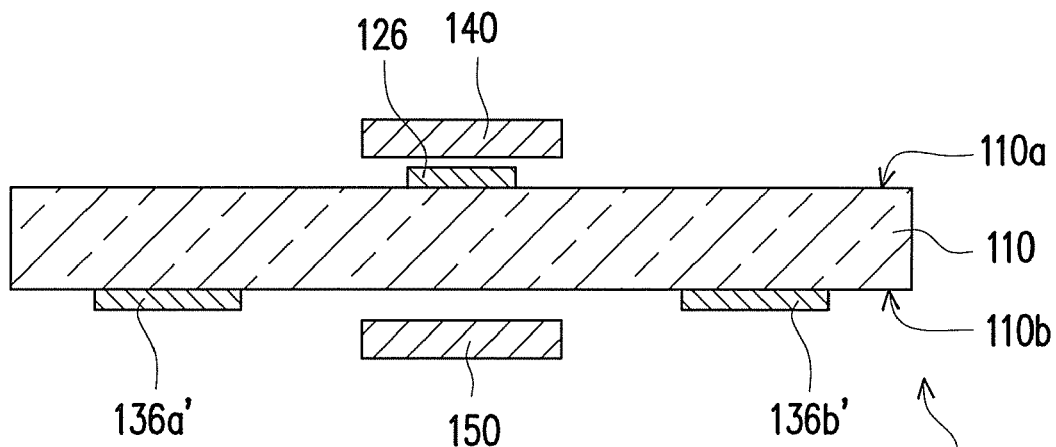
FIG. 10 is a cross-sectional diagram of a circuit board structure according to yet another embodiment of the present invention.

FIG. 10 is a cross-sectional diagram of a circuit board structure according to yet another embodiment of the present invention. Referring to FIGS. 9 and 10, the circuit board structure 100*j* of FIG. 10 is similar to the circuit board structure 100*i* of FIG. 9 except that the circuit board structure 100*j* of FIG. 10 further includes a second ferrite element 150. The second ferrite element 150 is disposed at the lower surface 110*b* of the dielectric layer 110, wherein the orthogonal projections of the first ferrite element 140, the second ferrite element 150 and the first metallic neck 126 on the upper surface 110*a* of the dielectric layer 110 are overlapped with each other, which means the second ferrite element 150 does not overlay the second metallic necks 136*a'* and 136*b'*.

Figure 11:
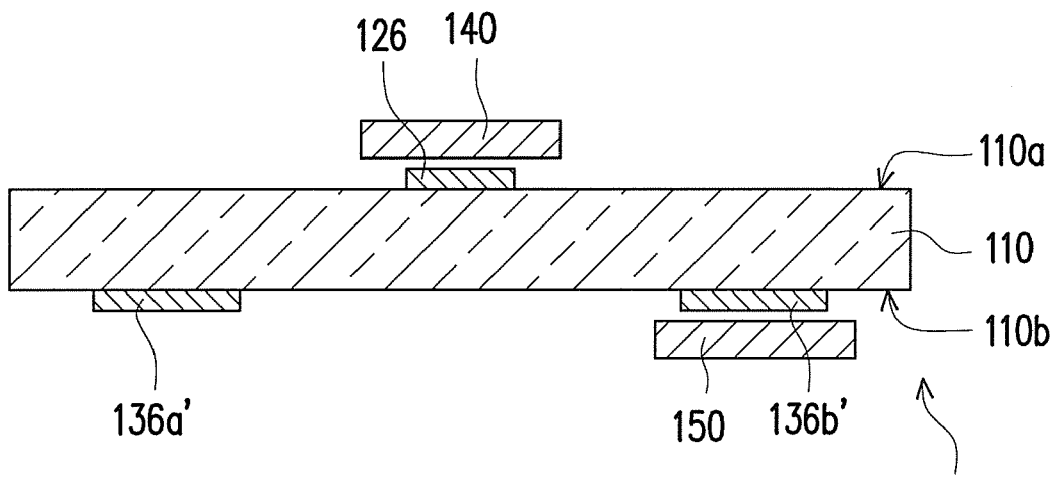
FIG. 11 is a cross-sectional diagram of a circuit board structure according to yet another embodiment of the present invention.

FIG. 11 is a cross-sectional diagram of a circuit board structure according to yet another embodiment of the present invention. Referring to FIGS. 10 and 11, the circuit board structure 100*k* of FIG. 11 is similar to the circuit board structure 100*j* of FIG. 10 except that the second ferrite element 150 of the circuit board structure 100*k* of FIG. 11 overlays the second metallic neck 136*b'*, and the orthogonal projections of the first ferrite element 140 and the second ferrite element 150 on the upper surface 110*a* of the dielectric layer 110 are not overlapped with each other.

Figure 12:
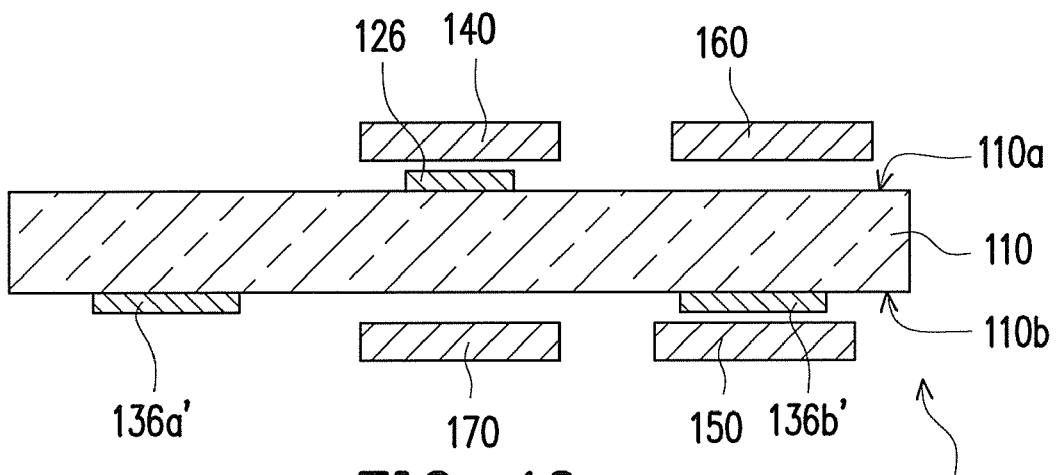
FIG. 12 is a cross-sectional diagram of a circuit board structure according to yet another embodiment of the present invention.

FIG. 12 is a cross-sectional diagram of a circuit board structure according to yet another embodiment of the present invention. Referring to FIGS. 11 and 12, the circuit board structure 100*l* of FIG. 12 is similar to the circuit board structure 100*k* of FIG. 11 except that the circuit board structure 100*l* of FIG. 12 further includes a third ferrite element 160 and a fourth ferrite element 170. The third ferrite element 160 is disposed on the upper surface 110*a* of the dielectric layer 110 and overlays the orthogonal projection of the second metallic neck 136*b'* on the upper surface 110*a* of the dielectric layer 110. The fourth ferrite element 170 is disposed at the lower surface 110*b* of the dielectric layer 110 and overlays the orthogonal projection of the first metallic neck 126 on the lower surface 110*b* of the dielectric layer 110. The orthogonal projections of the first ferrite element 140 and the fourth ferrite element 170 on the upper surface 110*a* of the dielectric layer 110 are overlapped with each other; the orthogonal projections of the third ferrite element 160 and the second ferrite element 150 on the upper surface 110a of the dielectric layer 110 are overlapped with each other.

It should be noted that although the widths of the first metallic neck 126 and the second metallic neck 136 (or 136a, 136b, 136a' and 136b') in the circuit board structures 100a-1001 of the above-mentioned embodiments are different from each other, but in other unshown embodiments, the widths of the first metallic neck and the second metallic neck can be the same as each other if the orthogonal projections of the first metallic neck and the second metallic neck on a surface of the dielectric layer are not overlapped with each other and at least one of the orthogonal projections of the first metallic neck and the second metallic neck on a surface of the dielectric layer is overlaid by the employed ferrite element. The above-mentioned design, i.e., the design where the widths of the first metallic neck and the second metallic neck can be the same as each other, is still acceptable by the present invention and falls in the scope of the present invention.

Experiment Result Examples

Some experiments aimed at a conventional circuit board structure and several circuit board structures of the present invention are conducted respectively. In the tested circuit board structures, the noise-isolating effect between two adjacent circuit areas is indicated by transmission coefficient $S_{21}$ among the scattering parameters. When the transmission coefficient is lower, it indicates the electromagnetic wave transmission between two adjacent circuit areas is poorer, i.e., the noise-isolating effect between two adjacent circuit areas in the circuit board structure is better. Therefore, in the embodiment, the frequency range to be tested is defined between 0.6 GHz and 1.8 GHz, and as the result of the experiments, transmission coefficient $S_{21}$ is ranged between 0 dB and −35 dB.

In more details, the experiments are conducted on the circuit board structure 100f of FIG. 6 and a conventional circuit board structure, wherein the conventional circuit board structure is similar to the circuit board structure 100f of FIG. 6 except that the orthogonal projections of the first metallic neck and the second metallic neck on the upper surface of the dielectric layer are overlapped with each other and the employed ferrite encloses the first metallic neck, the second metallic neck and the dielectric layer located between the first metallic neck and the second metallic neck.

Figure 13:
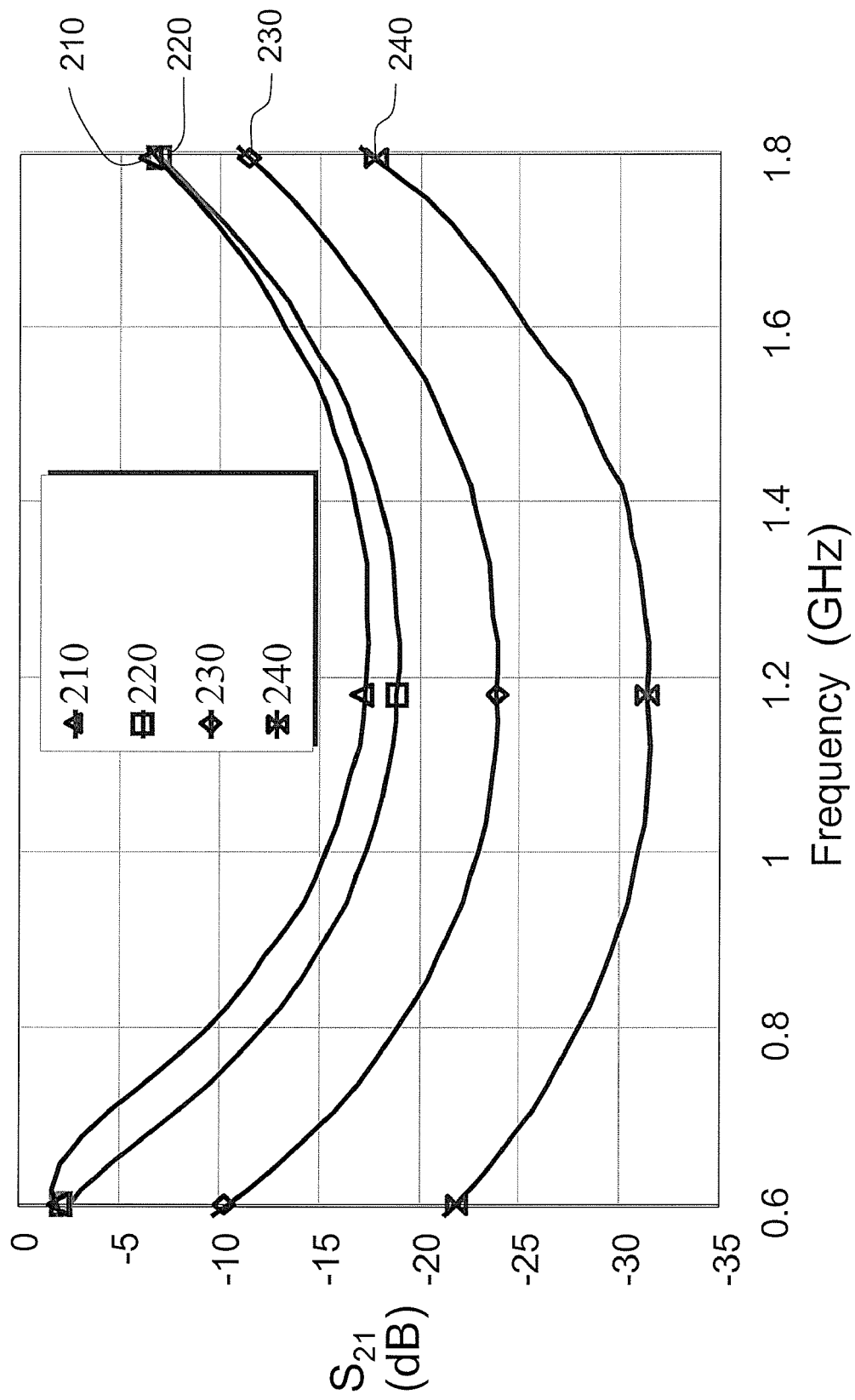
FIGS. 13 and 14 are two graphs showing the relationships between the transmission coefficient and the frequency for several circuit board structures.

FIG. 13 shows the relationships between the transmission coefficient and the frequency corresponding to several conditions. Referring to FIG. 13, the curve 210 herein represents the tested conventional circuit board structure except that no ferrite element is employed. The curve 220 herein represents the tested conventional circuit board structure. The curve 230 herein represents the circuit board structure 100f of the present invention except that no ferrite element is employed. The curve 240 herein represents the circuit board structure 100f of the present invention.

It can be seen from the curves 210 and 230 in FIG. 13 that two designs with or without overlaying the orthogonal projections of the first metallic neck and the second metallic neck on the upper surface of the dielectric layer would affects the noise-isolating effect between two adjacent circuit areas. In more details, the two transmission coefficients $S_{21}$ of the curves 210 and 230 has a difference of about 7 dB about 1.2 GHz, which means without employing the ferrite element the above-mentioned design of the embodiment without overlaying the orthogonal projections of the first metallic neck 126 and the second metallic neck 136 on the upper surface 110a of the dielectric layer 110 exhibits a better noise-isolating effect than the conventional design with overlaying the orthogonal projections of the first metallic neck and the second metallic neck on the upper surface of the dielectric layer In other words, the circuit board structure 100f of the present invention without employing the ferrite element has a better noise-isolating effect in comparison with the conventional circuit board structure.

In addition, the suppressing of the electromagnetic noise of the circuit board structure can be further improved by employing the ferrite or the ferrite element as shown in the experiment data. The two transmission coefficients $S_{21}$ of the curves 210 and 220 has a difference of about 1 dB and the two transmission coefficients $S_{21}$ of the curves 230 and 240 has a difference of about 9 dB about 1.2 GHz. In particular, the two transmission coefficients $S_{21}$ of the curves 220 and 240 has a difference of about 13 dB, which suggests the above-mentioned design exhibits a better electromagnetic noise-isolating effect, where the orthogonal projections of the first metallic neck 126 and the second metallic neck 136 on the upper surface 110a of the dielectric layer 110 are not overlapped with each other in association with employing the first ferrite element 140a and the second ferrite element 150a.

In short, from the above-mentioned experiment example, it can be concluded that the design of the circuit board structure 100f of the present invention exhibits a better noise-isolating effect, where the orthogonal projections of the first metallic neck 126 and the second metallic neck 136 on the upper surface 110a of the dielectric layer 110 are not overlapped with each other. Meanwhile, by employing the first ferrite element 140a and the second ferrite element 150a to overlay the first metallic neck 126 and the second metallic neck 136, the circuit board structure 100f can effectively suppress the magnetic field intensity and reduce the electromagnetic noise transmitting capability, which benefits suppressing electromagnetic noise.

Figure 14:
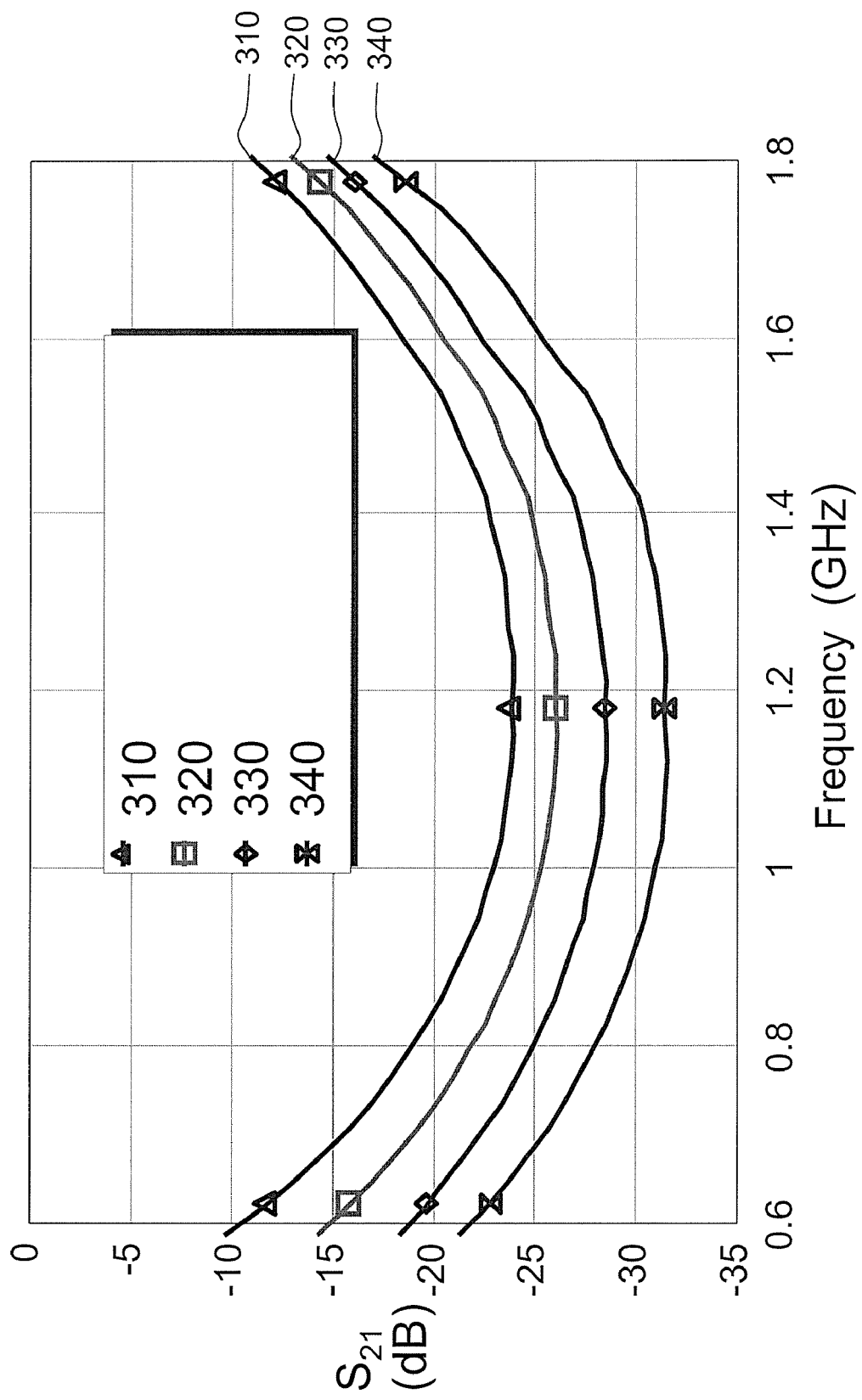

The effect of suppressing electromagnetic noise also depends on the area of overlaying the metallic neck by the ferrite element. FIG. 14 shows the relationships between the transmission coefficient and the frequency for several circuit board structures. The curve 310 herein represents the circuit board structure 100a without employing first ferrite element 140a. The curve 320 herein also represents the circuit board structure 100a where the employed first ferrite element 140 overlays the first metallic neck 126, the curve 330 herein represents the circuit board structure 100c of the present invention, and the curve 340 herein represents the circuit board structure 100f of the present invention.

It can be seen from the experiment data in FIG. 14 that the curve 340 has the smallest transmission coefficient $S_{21}$ in comparison with the curves 330, 320 and 310; i.e., the larger the overlaid area of the first metallic neck 126 and the second metallic neck 136 by the ferrite elements is, the more distinguished effect of suppressing the magnetic field intensity by the ferrite elements is. In other words, the more powerful the capability of the ferrite elements to reduce electromagnetic noise transmitting, the better the achieved effect of suppressing electromagnetic noise is.

In summary, due to the design of the circuit board structure of the present invention wherein the orthogonal projections of the first metallic neck and the second metallic neck on the upper surface of the dielectric layer are not overlapped with each other, the magnetic field produced by the electromagnetic noise transmitted between two adjacent circuit areas would be distributed within an area located at the outside of the dielectric layer and close to the first metallic neck and the second metallic neck rather than being concentrated in the dielectric layer between the first metallic neck and the second metallic neck. In addition, the magnetic field intensity can be suppressed by employing the ferrite elements to overlay the metallic necks, which contributes reducing the transmission of the electromagnetic noise so as to achieve the effect of suppressing the electromagnetic noise.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A circuit board structure, comprising:
a dielectric layer, having an upper surface and a lower surface opposite to the upper surface;
a first metal layer, disposed on the upper surface of the dielectric layer and having a first circuit area, a second circuit area and a first metallic neck connecting the first circuit area and the second circuit area;
a second metal layer, disposed on the lower surface of the dielectric layer and having a third circuit area, a fourth circuit area and at least a second metallic neck connecting the third circuit area and the fourth circuit area, wherein the orthogonal projections of the first metallic neck and the second metallic neck on the upper surface of the dielectric layer are not overlapped with each other; and
a first ferrite element, disposed on the upper surface of the dielectric layer and overlaying at least one of the orthogonal projections of the first metallic neck and the second metallic neck on the upper surface of the dielectric layer.

2. The circuit board structure as claimed in claim 1, wherein the orthogonal projections of the first ferrite element and the second metallic neck on the upper surface of the dielectric layer are overlapped with each other.

3. The circuit board structure as claimed in claim 1, further comprising a second ferrite element disposed at the lower surface of the dielectric layer.

4. The circuit board structure as claimed in claim 3, wherein the orthogonal projections of the second ferrite element, the first ferrite element and the first metallic neck on the upper surface of the dielectric layer are overlapped with each other.

5. The circuit board structure as claimed in claim 3, wherein the orthogonal projections of the first ferrite element and the second metallic neck on the upper surface of the dielectric layer are overlapped with each other, and the orthogonal projections of the second ferrite element, the first ferrite element and the first metallic neck on the upper surface of the dielectric layer are overlapped with each other.

6. The circuit board structure as claimed in claim 3, wherein the second ferrite element overlays the second metallic neck.

7. The circuit board structure as claimed in claim 6, wherein the orthogonal projections of the second ferrite element, the first ferrite element and the second metallic neck on the upper surface of the dielectric layer are overlapped with each other.

8. The circuit board structure as claimed in claim 1, wherein the material of the dielectric layer comprises glass fiber.

9. The circuit board structure as claimed in claim 1, wherein the material of the first metal layer comprises copper.

10. The circuit board structure as claimed in claim 1, wherein the material of the second metal layer comprises copper.

* * * * *